United States Patent [19]

Bessedine

[11] Patent Number: 4,587,077
[45] Date of Patent: May 6, 1986

[54] SAFETY ACTUATOR RELEASE DEVICE

[75] Inventor: Anatole Bessedine, Domene, France

[73] Assignee: Commissariat a l'Energie Atomique, Paris, France

[21] Appl. No.: 448,626

[22] Filed: Dec. 10, 1982

[30] Foreign Application Priority Data

Dec. 11, 1981 [FR] France .................. 81 23203

[51] Int. Cl.$^4$ .................. G21C 7/00; G21C 17/00; G06G 7/14
[52] U.S. Cl. .................. 376/215; 376/259
[58] Field of Search .................. 376/215, 259; 330/63, 330/8

[56] References Cited

U.S. PATENT DOCUMENTS

| | | | |
|---|---|---|---|
| 3,424,652 | 1/1969 | Oehmann | 376/259 |
| 3,437,556 | 4/1969 | Bevilacqua et al. | 376/259 |
| 3,855,590 | 12/1974 | Neuner | 376/259 |
| 4,054,486 | 10/1977 | Lefebvre et al. | 376/215 |
| 4,105,496 | 8/1978 | Therond | 376/215 |
| 4,434,132 | 2/1984 | Cook | 376/259 |

FOREIGN PATENT DOCUMENTS

| | | | |
|---|---|---|---|
| 1196229 | 7/1965 | Fed. Rep. of Germany . | |
| 838809 | 11/1958 | United Kingdom . | |
| 1336296 | 11/1973 | United Kingdom . | |
| 2040522 | 8/1980 | United Kingdom | 376/259 |

OTHER PUBLICATIONS

Technishe Rundschau, vol. 11, No. 54, (12/27/68) Schneider.

Automatisme, vol. 11, No. 9 (9/57) pp. 344–351, Mathias et al.
Bulletin de la Societe Francaise des Electriciens, vol. 1, No. 10 (10/60) pp. 711–720, Versini.

Primary Examiner—Salvatore Cangialosi
Attorney, Agent, or Firm—Handal & Morofsky

[57] ABSTRACT

Safety actuator release device incorporating a release means, whereof one output supplies an output signal which can have two logic states, one of these states corresponding to the release of the actuator and the other state corresponding to the absence of the release of the actuator, testing and control means of said release means, whereby said testing and control means have two control inputs receiving the control signals from the release means in order that the output signal has one of two logic states and a test input receiving a test signal in such a way that said output supplies an output signal, whose logic state corresponds to the release of the actuator, even if the control signals lead to the supply of an output signal corresponding to the absence of release, wherein the testing and control means are constituted by three primary windings of a magnetic amplifier, two of these primary windings receiving direct currents corresponding to the control signals, while another of these windings is a test winding receiving a direct current corresponding to the test signal, the release means being constituted by a secondary winding of the magnetic amplifier, said secondary winding beign connected to an alternating current supply, the actuator being connected to this winding via a bridge rectifier.

Application to the protection of nuclear reactors.

4 Claims, 3 Drawing Figures

SAFETY ACTUATOR RELEASE DEVICE

BACKGROUND OF THE INVENTION

The present invention relates to a release device for a safety actuator. It more specifically relates to the release of a safety actuator and to safety actuators making it possible to initiate a protective action in a nuclear reactor.

For example, it is known that a nuclear reactor comprises a large number of devices making it possible to control its operation. These devices are called safety actuators. In the case of an accident or incident, these actuators can be released extremely rapidly in such a way that their protective action can stop the incident. In nuclear reactors, the values of a certain number of physical quantities, such as the pressure, temperature, neutron flux, etc are measured at a certain number of points. The values of these quantities are then compared with reference values in various devices. These devices normally supply logic comparison signals with a non-zero value, when the values of the physical quantities are within a predetermined value range, corresponding to the normal operation of the reactor. When the physical quantities pass outside this safety range, the devices supply logic output signals, e.g. with zero values. It is the output signals of these devices which are applied to the safety actuator release devices. In certain cases, these release devices are of the logic 2/2 type making it possible to initiate an emergency action by a signal supplied at an output, said signal being e.g. of logic state 1, when two of its inputs receive control signals, whose logic state is 0. These control signals come from the aforementioned devices.

Safety actuator release devices are known, which comprise release means constituted e.g. by a reversed output OR gate, two of the inputs of this gate being respectively connected to the outputs of two AND gates having two inputs. Each of these gates receives at one of their control inputs, a control signal coming from the aforementioned devices, whilst another input can receive a test signal making it possible to impose at the output of the OR gate, a signal with a predetermined logic state 1, no matter what the logic state of the control signals applied to each of the control inputs of the two AND gates.

The main disadvantage of the known devices is that they can only control low power actuators. However, in many fields and particularly in nuclear reactors, the safety actuators require a relatively high power level, which cannot be obtained by means of logic circuits integrated onto a semiconductor substrate.

BRIEF SUMMARY OF THE INVENTION

The problem of the present invention is to obviate these disadvantages and provide a safety actuator release device having a higher output power than that obtained with devices incorporating integrated circuits.

According to the invention, this problem is solved by a safety actuator release device incorporating a release means, whereof one output supplies an output signal which can have two logic states, one of these states corresponding to the release of the actuator and the other state corresponding to the absence of the release of the actuator, testing and control means of said release means, whereby said testing and control means have two control inputs receiving the control signals from the release means in order that the output signal has one of two logic states and a test input receiving a test signal in such a way that said output supplies an output signal, whose logic state corresponds to the release of the actuator, even if the control signals lead to the supply of an output signal corresponding to the absence of release, wherein the testing and control means are constituted by three primary windings of a magnetic amplifier, two of these primary windings receiving direct currents corresponding to the control signals, whilst another of these windings is a testing winding receiving a direct current corresponding to the test signal, the release means being constituted by a secondary winding of the magnetic amplifier, said secondary winding being connected to an alternating current supply, the actuator being connected to this winding via a bridge rectifier.

According to another feature of the invention, the number of ampere turns of the windings are chosen in such a way that when the number of ampere turns of the primary windings are zero, the average intensity of the current corresponding to the output signal applied to the release device is maximum and corresponds to the release logic state of the actuator, said intensity being below a predetermined threshold and corresponding to the logic state of absence of actuator release when the numbers of ampere turns of the control windings are both, or in one case higher than a predetermined value when the number of ampere turns of the test winding is zero, said intensity being maximum and corresponding to the logic release state of the actuator when the numbers of ampere turns of the control windings are both or in one case higher than a predetermined value, whilst the number of ampere turns of the test winding exceeds a predetermined value.

According to another feature of the invention, the number of turns of the test winding is double the number of turns of each control winding, the intensities of the currents circulating in the control windings and in the test winding being equal when the numbers of ampere turns of these windings exceeds the predetermined values, the direction of the current in the test winding being opposite to the direction of the currents in each control winding.

According to another feature, the power supply is a sine-wave voltage supply, the bridge rectifier being a full-wave rectifier.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
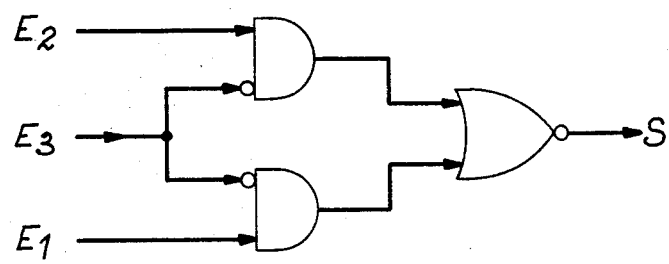
FIG. 1 a known safety actuator release device having integrated circuits on semiconductor substrates.

FIG. 1 diagrammatically shows a safety actuator release device according to the prior art comprising low power logic circuits integrated onto a semiconductor substrate. This device comprises release means constituted by an OR gate 1, whose output S supplies an output signal which can have two logic states 0 or 1. One of these states (e.g. logic state 1) corresponds to the release of a safety actuator receiving the signal supplied by output S and the other state (e.g. 0) corresponds to the absence of release of said actuator. This device also comprises testing and control means with respect to the release means. The testing and control means are in this case constituted by logic AND gates 1 and 2. These gates have control inputs E1 and E2, which respectively receive the control signals from the release means (OR gate 1). These control signals come from the aforementioned means and make it possible to compare with reference values, the values of parameters supplied by transducers. The second inputs E3 of these gates are test inputs, which receive a test signal. The logic state of this test signal is such that, no matter what the logic states of the control signals applied to inputs E1 and E2, output S of the device supplies a signal, whose logic state (e.g. 1) corresponds to the release of the actuator. The test inputs of AND gates 1 and 2 are reversed inputs, whilst the output of the OR gate is a reversed output.

The following logic table represents the logic states of the signals at different points of the device and provides a better understanding of the operation thereof:

| E1 | E2 | E3 | S |
|----|----|----|---|
| 1  | 1  | 0  | 0 |
| 0  | 1  | 0  | 0 |
| 1  | 0  | 0  | 0 |
| 0  | 0  | 0  | 1 |
| 1  | 0  | 1  | 1 |
| 0  | 1  | 1  | 1 |
| 1  | 1  | 1  | 1 |
| 0  | 0  | 1  | 1 |

In this table, logic state 0 represents an absence of information or voltage, whilst logic state 1 represents the presence of information or voltage. It should be noted in this table that when test input E3 receives a signal of logic level 0, the output S of this device remains at logic state 0, whilst the two control inputs E1 and E2, or at least one of these, receives signals at logic state 1.

For the output signal S of the device to pass to logic state 1, corresponding to the release of an actuator, it is necessary for the two inputs E1 and E2 to simultaneously receive a signal of logic state 0. This case appears in the fourth and eighth lines of the table. It can be seen that in this case if the two inputs E1 and E2 receive a control signal of logic state 0, a release signal of logic state 1 is available at the output S of the device, no matter what the logic state of the test signal applied to test input E3 of the device.

The fifth, sixth and seventh lines of the table show that in the case where the test input E3 receives a test signal of logic state 1, the output S of the device remains in logic state 1, even if the two control inputs E1 and E2 or at least one of these inputs receives a signal which is at logic state 1. Thus, the application of a test signal of logic state 1 to the test input E3 of the device, leads to the appearance of a release signal of logic state 1 and at the output of the device, no matter what the logic state of the control signals applied to inputs E1 and E2.

Figure 2:
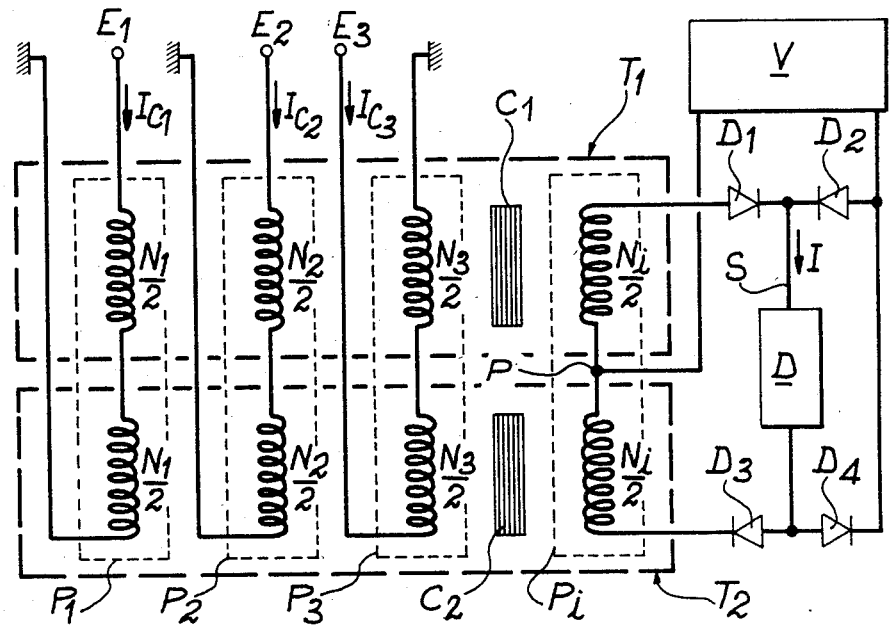
FIG. 2 diagrammatically a release device according to the invention.

FIG. 2 diagrammatically shows a safety actuator release device according to the invention, whose operation is in accordance with the preceding logic table. This device will be described hereinafter and comprises release means, as well as means for controlling and testing the said release means. The testing means make it possible, when they receive a test signal having a predetermined logic state, to control the release means in such a way that the latter supply at their output, a signal corresponding to the release of a safety actuator. This release signal appears even if the control signals applied to the control means normally correspond to the absence of actuator release. In this device, the testing and control means, as well as the release means, are parts of a magnetic amplifier constituted by two identical toroidal transformers T1 and T2 with a rectangular hysteresis cycle. Two of the primary windings P1 of each of these transformers, which are connected in series, form a winding P1 receiving control signals at its input E1. In the same way, two other primary windings, connected in series, of each of these transformers form a winding P2 receiving control signals at its input E2, said signals corresponding to current IC1, IC2. A third primary winding P3 of the transformer is a test winding receiving at an input E3, a test current IC3 corresponding to the aforementioned test signal. This current can be supplied by a not shown power supply. In the drawing, N1/2, N2/2, N3/2 designate the numbers of turns of the primary windings of each transformer constituting the magnetic amplifier. These release means are constituted by the secondary winding Pi of the magnetic amplifier, which in this case has two identical windings of the secondaries of transformers T1 and T2. In the drawing, Ni/2 designates the number of turns of each secondary winding of the transformers T1 and T2. The secondary winding of the magnetic amplifier is connected to a sine-wave alternating current supply V. The latter is connected between the common point O of the secondaries of transformers T1 and T2 and one of the terminals of a bridge rectifier comprising diodes D1, D2, D3 and D4, in the diagonal of which is connected the safety actuator diagrammatically represented at D.

Reference I designates the mean value of the rectified current, whereas $C_1$ and $C_2$ represent the magnetic casings of transformers T1 and T2. The directions of the currents in the windings are indicated by the arrows in the drawing. The direction of the current IC3 in the test winding is opposite to the directions of currents IC1 and IC2 in the control windings.

Figure 3:
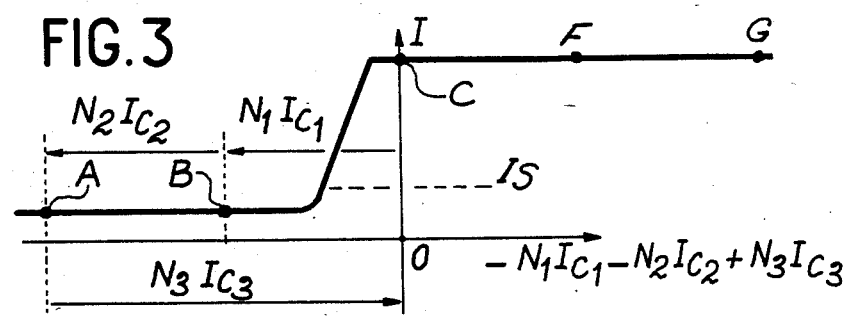
FIG. 3 a diagram showing the variation of the average rectified current intensity circulating in the actuator, as a function of the number of ampere turns of the primary winding of the magnetic amplifier of the device according to the invention.

FIG. 3 provides a better understanding of the operation of the device according to the invention. FIG. 3 constitutes a transfer diagram representing the variations of the mean value of the rectified current I in actuator D, as a function of the sum of the numbers of ampere turns N1IC1-N2IC2-N3IC3 of the primary windings of the magnetic amplifier (IC1, IC2 and IC3 being positive). According to a preferred embodiment, it is assumed that the number of ampere turns in the secondary winding of the amplifier, which corresponds to the product of the number Ni of turns of said winding with the mean value of the intensity of the rectified current I of actuator D, is equal to the algebraic sum of the ampere turns of the primary windings. It is also assumed that the number of turns N3 of the test winding is double the number of turns of each control winding, so that N3=2N1=2N2. Finally, the absolute values of the intensities of the control and test direct currents IC1, IC2, IC3 circulating in each of the three primary windings are equal.

Thus, the numbers of ampere turns are chosen in such a way that when the numbers of ampere turns N1IC1, N2IC2, N3IC3 (the intensities of currents IC1, IC2, IC3 being 0), the value of the intensity of the mean current I in the actuator, i.e. at the output S of the release means, is at a maximum. This maximum intensity corresponds to the appearance of an actuator release signal having logic state 1, whilst 0 values of the intensities of currents IC1, IC2, IC3 in each control and test primary winding correspond to logic states 0. Thus, this state corresponds to the fourth line of the logic table described hereinbefore and to the release of the actuator by control signals. The operating point on the transfer diagram of FIG. 3 is at C.

The mean intensity value of the rectified current I circulating in actuator D is below a predetermined threshold IS, when the numbers of ampere turns N1IC1, N2IC2 of the control windings (inputs E1 and E2) are in one or both cases higher than a predetermined value, whilst the number of ampere turns N3IC3 (input E3 of the test winding is 0). This case corresponds to the three first lines of the aforementioned logic table.

The intensity of the current IC3 in the test winding is 0, which corresponds to a test signal of logic state 0 applied to the test winding. The intensities of currents IC1 and IC2 are such that the numbers of ampere turns N1IC1, N2IC2 in the two control windings are in one or both cases in excess of a predetermined value. This means for example, that if only the number of ampere turns N1IC1 exceeds the predetermined value, whereas the numbers of ampere turns N2IC2, N3IC3 are equal to 0, the operating point is located at B in the diagram of FIG. 3, the intensity of current I in the actuator being below the threshold IS. This case corresponds to the third line of the table of FIG. 2, the logic state of the signal on output S being considered as logic state 0.

The same reasoning can be used for N2IC2 exceeding a predetermined value and for N3IC3 and N1IC1 equal to 0, the case corresponding to the second line of the logic table.

If the number of ampere turns N3IC3 in the test winding is still equal to 0, whilst the numbers of ampere turns N1IC1 and N2IC2 of the control windings exceed a predetermined value, the operating point is located at A in FIG. 3. The value of the mean rectified current in actuator D is below threshold IS and this case still corresponds to a signal having logic state 0 at the output S of the device (first line of the above logic table).

Consideration will now be given to the different operating cases for which the number of ampere turns N3IC3 of the test winding exceeds a predetermined value, the operating point being at C, F or G in the transfer diagram. In this case, the value of the mean rectified current in actuator D is at a maximum. This value corresponds to the application of a logic state 1 to the input of actuator D. This logic state is maintained no matter what the values N1IC1, N2IC2 of the numbers of ampere turns of the control windings. If the numbers of ampere turns N1IC1, N2IC2 are below a predetermined threshold, the signals applied to inputs E1 and E2 can be considered as having logic state 0. The operating point is located at G on the transfer diagram. This case corresponds to the eighth line of the logic table. The logic state of the signal at output S is 1. If, however, the number of ampere turns N1IC1, N2IC2 exceed a predetermined value, the signals applied to inputs E1 and E2 of the device are considered as signals of logic state 1, which corresponds to the seventh line of the logic table. The logic state of the signal at output S is 1 and the operating point is C.

Finally, if one of the numbers of ampere turns N1IC1, N2IC2 exceeds the predetermined value, a signal of logic state 1 is applied to one of the control inputs E1 or E2 of the device, whilst a signal of logic state 0 is applied to the other control input or vice versa. This case corresponds to the fifth and sixth lines of the logic table. The logic state of the signal at output S is 1 and the operating point is F.

Thus, the application of test signals with a preferred logic level 1 to test input E3 of the device lead to the supply of a release signal of logic state 1 to the output S of the device, no matter what the logic states of the signals applied to the control inputs of this device.

The device described hereinbefore makes it possible to release a safety actuator requiring a release power which is higher than that which can be supplied by conventional logic circuits. It also makes it possible to confirm, no matter what the control signal supplied to it and as a result of the test signals applied thereto, that the actuator can be released by a signal, whose logic state corresponds to this release. Finally, as a result of this device, the tests are "transparent". Thus, no matter what the test signal applied to test input $E_3$, the security action (actuator release) can be realised by applying signals releasing this action to inputs E1, E2.

What is claimed is:

1. A safety actuator release device, comprising, release means ($P_i$), one output (S) of said release means supplying an output signal which can have two logic states, one of said states corresponding to release of the actuator (D) and the other state corresponding to actuation of said actuator; testing and control means ($P_1$, $P_2$, $P_3$) for said release means ($P_i$), said testing and control means having two control inputs ($E_1$, $E_2$) receiving control signals from said release means in order that said output signal has one of two logic states and a test input ($E_3$) receiving a test signal, said output supplying in response to said test signal an output signal, whose logic state corresponds to the release of the actuator, and overriding any control signals which would otherwise cause an output signal corresponding to actuation of said actuator, said testing and control means ($P_1$, $P_2$, $P_3$,) comprising three primary windings of a magnetic amplifier, two of said primary windings ($P_1$, $P_2$) receiving direct currents corresponding to said control signals, and the remaining winding ($P_3$) being a test winding and receiving a direct current corresponding to the test signal, said release means being a secondary winding ($P_i$) of the magnetic amplifier, said secondary winding being connected to an alternating current supply, and said actuator (D) being connect to said secondary winding via a bridge rectifier ($D_1$, $D_2$, $D_3$).

2. A device according to claim 1, wherein the number of ampere turns of the windings are chosen in such a way that when the number of ampere turns of the primary windings ($P_1$, $P_2$, $P_3$) are zero, the average intensity of the current (I) corresponding to the output signal applied to the release device (D) is maximum and corresponds to the release logic state of the actuator, said intensity being below a predetermined threshold ($I_s$) and corresponding to the logic states of actuation when the number of ampere turns of the control windings ($P_1$, $P_2$) are both, or in one case higher than a predetermined value when the number ampere turns of the test winding ($P_3$) is zero, said intensity being maximum and corresponding to the logic release state of the actuator (D) when the number of ampere turns of the control windings ($P_1$, $P_2$) are both or one case higher than a predetermined value, whilst the number of ampere turns of the test winding ($P_3$) exceeds a predetermined value.

3. A device according to claim 2, wherein the number of turns of the test winding is double the number of turns of each control winding, the intensities of the currents circulating in the control windings and in the test winding being equal when the number of ampere turns of these windings exceeds the predetermined value, the direction of the current in the test winding being opposite to the direction of the currents in each control winding.

4. A device according to claim 2, wherein said bridge rectifier is a full-wave rectifier.

* * * * *

UNITED STATES PATENT AND TRADEMARK OFFICE
CERTIFICATE OF CORRECTION

PATENT NO. : 4,587,077
DATED : May 6, 1986
INVENTOR(S) : BESSEDINE, Anatole

It is certified that error appears in the above-identified patent and that said Letters Patent is hereby corrected as shown below:

The indication of assignee on the face of the above patent should read as follows:

Commissariat A L'Energie Atomique
Paris, France

FRAMATOME & CIE
Courbevoie, France; and

Merlin Gerin
Grenoble, France

Signed and Sealed this

Fourth Day of November, 1986

[SEAL]

Attest:

DONALD J. QUIGG

Attesting Officer

Commissioner of Patents and Trademarks